United States Patent
Zhao et al.

(10) Patent No.: US 8,748,815 B2
(45) Date of Patent: Jun. 10, 2014

(54) METHOD AND SYSTEM FOR DETECTING OR REVIEWING OPEN CONTACTS ON A SEMICONDUCTOR DEVICE

(75) Inventors: Frederick Y. Zhao, San Jose, CA (US); Jack Y. Jau, Los Altos Hills, CA (US)

(73) Assignee: Hermes Microvision, Inc., Hsinchu (TW)

( * ) Notice: Subject to any disclaimer, the term of this patent is extended or adjusted under 35 U.S.C. 154(b) by 1451 days.

(21) Appl. No.: 11/515,328

(22) Filed: Aug. 31, 2006

(65) Prior Publication Data

US 2008/0054931 A1 Mar. 6, 2008

(51) Int. Cl.
*H01J 37/28* (2006.01)
(52) U.S. Cl.
USPC ............ 250/310; 324/751; 324/765
(58) Field of Classification Search
CPC ....................................... H01J 37/28
USPC ....................................... 250/310
See application file for complete search history.

(56) References Cited

U.S. PATENT DOCUMENTS

| 4,417,203 | A | 11/1983 | Pfeiffer et al. |
| 4,843,330 | A | 6/1989 | Golladay et al. |
| 6,504,393 | B1 * | 1/2003 | Lo et al. ............... 324/754.22 |
| 6,700,122 | B2 * | 3/2004 | Matsui et al. ............ 250/310 |
| 6,720,779 | B1 | 4/2004 | Lee |
| 7,279,689 | B2 * | 10/2007 | Kadyshevitch et al. ... 250/492.1 |

* cited by examiner

*Primary Examiner* — Phillip A Johnston
(74) *Attorney, Agent, or Firm* — WPAT, PC; Justin King

(57) ABSTRACT

A method and system for detecting or reviewing defective contacts on a semiconductor device are disclosed. In a first embodiment, the method and system comprise providing a positive charge sufficient enough to turn on a gate of an associated MOS device and scanning an area of interest within the MOS device with a primary electron beam of proper landing energy to generate image. The method and system include analyzing the signal of contacts and identify the open contacts. In a second embodiment, the method and system comprises pre-scanning or irradiating the wafer surface defect with an accessory beam, a plurality of times, to achieve positive charged/sufficient to turn on the gate on the associated MOS devices of the wafer; and scanning the at least a portion of the device circuits with a primary electron beam of proper landing energy to generate images wafer or area of interest. The method and system include analyzing the signal and/or image of contacts and identify the open contacts.

58 Claims, 11 Drawing Sheets

930

METHOD AND SYSTEM FOR DETECTING OR REVIEWING OPEN CONTACTS ON A SEMICONDUCTOR DEVICE

FIELD OF THE INVENTION

The present invention relates generally to a method and system for detecting or reviewing features using a scanning electron microscope (SEM). More specifically, the present invention relates to a method and system for measuring and detecting or reviewing features at different process steps during semi-conductor device fabrication.

BACKGROUND OF THE INVENTION

In the manufacture of semiconductor devices, it is becoming increasingly important to detect electrical defects, such as open or short circuit defects, as early as possible in the fabrication process to shorten the development cycle and improve product yield. Advanced wafer inspection and review systems based on a Scanning Electron Microscope (SEM) system have been commonly used for detecting and reviewing electrical defects as a voltage contrast image.

FIG. 1 is a diagrammatic representation of an electron beam apparatus 100 (SEM) in accordance with one embodiment of the present invention. The SEM system 100 includes an electron gun (101 through 103) that generates primary electron beam 104. The SEM system 100 also includes one or more condenser lenses 105 and an objective lens 109 that focuses and directs the primary electron beam 104 substantially toward a specimen 113. The SEM system 100 also includes at least a set of deflectors 110 to raster scan the primary electron beam over an area of interest on the specimen 113. The SEM system 100 also includes an in-lens detector 107 arranged below a final aperture 106 to detect signal electrons 111 (including secondary electrons SE and/or backscattered electrons BSE) emanating from the specimen surface 113. The SEM also includes an image generator (not shown) to generate an image from the emanated electrons that can be displayed and/or stored in a computer system.

The fraction of total signal electrons (SE+BSE) produced by the primary electron beam, defined as total electron yield, depends on the material and the primary electron beam landing energy (LE). FIG. 2 is a chart which shows the curve of the total electron yield (201) as a function of primary beam LE. For most materials, there will be two LE points $E_1$ (203) and $E_2$ (204) where the curve (201) crossover the yield of 1 (202). $E_1$ and $E_2$ are called the first and second crossover point respectively. $E_1<LE<E_2$ defines a positive mode region; $LE<E_1$ and $LE>E_2$ defines a negative mode region. This enables SEM to reveal features of different electrical properties in voltage contrast image.

If features on a wafer are supposed to be well grounded or virtually grounded (by being connected to a very large capacitor), the charges induced during the process of primary electron scanning will be released easily or at least kept at a very low level. If a feature becomes defectively open or floating, charges will be accumulated. The open/floating feature will appears relatively dark if the primary electron landing energy is in the positive region ($E_1<LE<E_2$), or relatively bright if in negative region ($LE>E_2$).

If the normal features on wafer are supposed to be open or floating, such as a gate, the charging induced by primary electron scanning accumulates. If a feature shorts to ground or virtual ground abnormally, no charge or less charge can be accumulated on the feature. This will make the feature appear bright in relation to other features on the wafer if primary electron landing energy is in the positive region ($E_1<LE<E_2$) or the feature will be dark in relation to other features if in the negative mode region ($LE>E_2$).

Generally defective contacts to NMOS and PMOS can be identified from a voltage contrast image by using the SEM. Conventional approaches focus on ways to manipulate the associated pn-junctions into different kinds of modes or statuses. For instance, if scanning NMOS contacts in positive mode and PMOS contacts in negative mode, the corresponding pn-junctions will be set to forward biased mode. In both cases, charges on the normal contacts will be kept to a relative low level as excessive charges will be released to the substrate via the pn-junction. An open contact accumulates charge, thus it is distinguishable from the normal contacts in the SE signal or voltage contrast image.

For a deep trench DRAM, due to the contact materials used and device layout, conventional approaches exhibit ineffectiveness or insensitivity in identifying open bit contacts at the bit contact layer. Accordingly, what is needed is a system and method for overcoming the above-identified issues. The present invention addresses such a need.

SUMMARY OF THE INVENTION

A method and system for detecting or reviewing defective contacts on a semiconductor are disclosed. In a first embodiment, the method and system comprise providing a positive charge to the gate contacts of associated MOS devices and scanning an area of interest within the MOS devices with a primary electron beam of proper landing energy to generate image. The method and system include analyzing the signal or image of the contacts and identifying the open contacts.

In a second embodiment, the method and system comprises pre-scanning or irradiating the wafer surface entirely or partially with an accessory beam, a plurality of times, to achieve positive charging to turn on the gate on the associated MOS devices; and scanning the at least a portion of the MOS devices with a primary electron beam of proper landing energy to generate images on the area of interest. The method and system include analyzing the signal or image of contacts and identifying the open contacts.

DETAILED DESCRIPTION

The present invention relates generally to a method and system for detecting or reviewing defective contacts in the fabrication of semi-conductor devices by using a scanning electron microscope (SEM). The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A system and method in accordance with the present invention overcomes the above described problem and provides a method to identify open contacts on DRAM or the like structure, in which source and/or drain contacts constitute an array and share one or multiple common control gates. Defective contacts can be identified with the SEM utilizing a positive (extraction field) mode or a negative (retarding field) mode. To describe these modes in more detail refer to the following discussion in conjunction with the accompanying Figures.

Figure 1:
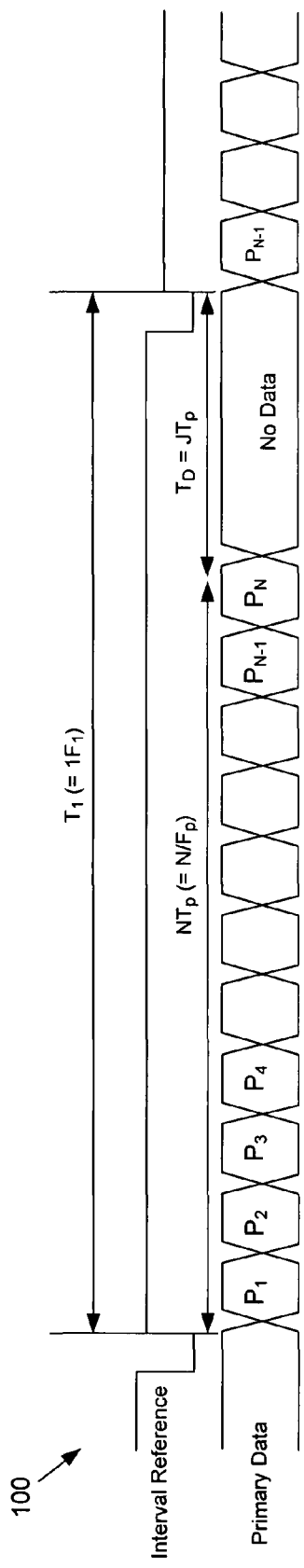
FIG. 1 is a diagrammatic representation of a scanning electron microscope in accordance with one embodiment of this invention.
Figure 2:
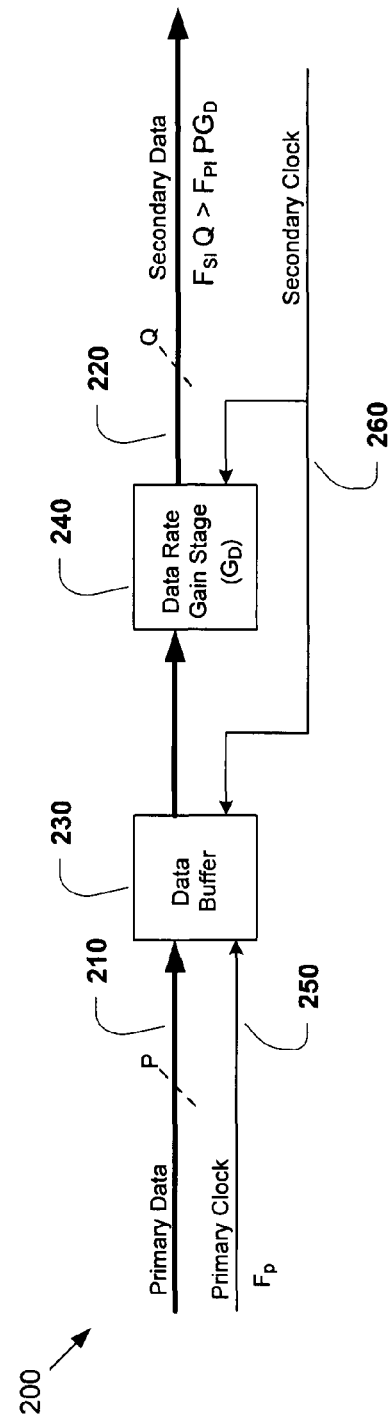
FIG. 2 is a graph of the relationship between the numbers of total electrons as a function of primary electron beam landing energy.

A first conventional embodiment uses the positive mode with the landing energy (FIG. 2) LE in between $E_1$ and $E_2$. Since a modern low landing energy SEM tends to negatively bias the wafer (refers to 310 of FIG. 3), or stage (not show) with respected to the final objective lens 311 to reduce the landing energy, there is naturally an extraction field imposed between the wafer 302 and SEM column 311. If the primary electron beam operates in a positive mode region, the sample surface tends to be charged up positively while scanning. Open contacts hold positive charges which attract SEs, thus making the contact appear dark in the voltage contrast image.

Figure 3:
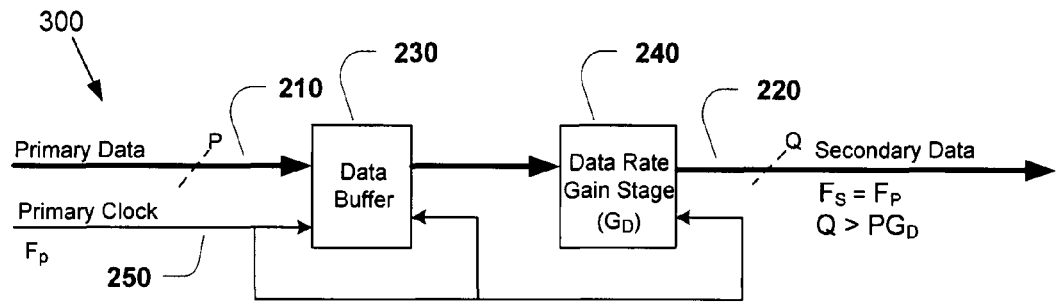
FIG. 3 illustrates the positive mode for identifying an open contact to N+ on PMOS.

FIG. 3 illustrates different effects of positive mode on NMOS and PMOS transistors 302a and 302b. For the NMOS transistor 302a, a positive surface charging imposes a reverse biased voltage on the associated pn-junction by primary beam scanning, which switches off the pn-junction. For normal contact 308a and open contact 309a, no significant different in signal can be made as indicated by 304 and 305. For the PMOS transistor 302b, a positive surface charge voltage (>0.7V) is induced to switch on the associated pn-junction, excessive charges on normal contacts will be released to the N-well, which contributes more SE signals 306 from the surface. Contrary to the normal contact 308b, an open contact 309b retains secondary electrons, as indicated by 307, thus making the contact appear dark in the voltage contrast image.

Instead of achieving a positive surface charging, a second conventional embodiment operates in a negative mode with a landing energy greater than $E_2$. As a result, negative charging is induced on the surface. If the charging cannot be released in time as in the case of the open contact, more SEs are generated and repelled in the proximity towards the detector, and therefore the open contact appears brighter than normal.

Figure 4:
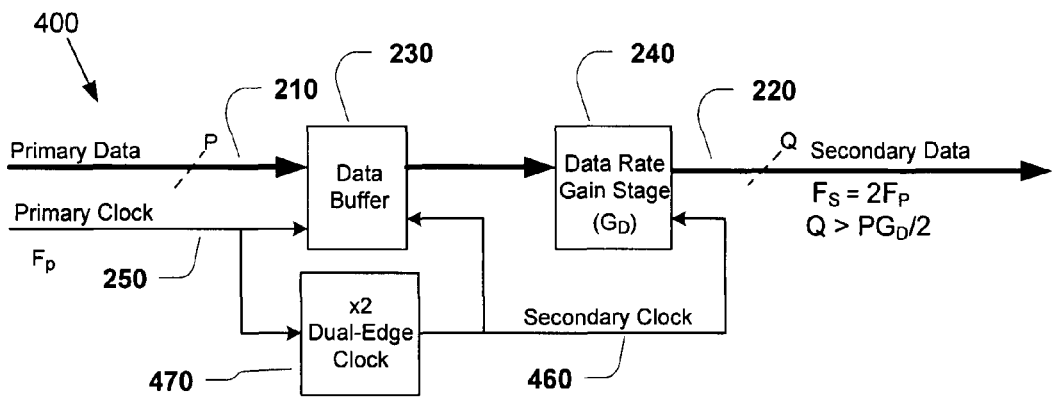
FIG. 4 illustrates the negative mode for identifying an open contact to P+ on NMOS.

FIG. 4, which illustrates the second conventional embodiment, depicts the effects of a negative mode on NMOS and PMOS transistors 402a and 402b. In the case of an NMOS transistor 402a, the negative charging voltage on the N+ plug can be strong enough to offset the global extraction field and forward bias the associated pn-junction. Excessive charges on the normal contact 408a will be released via the pn-junction resulting in less SE signals as indicated by 404. This differentiates open contact 409a from normal contact 408a in a NMOS transistor 402a. In the case of a PMOS transistor 402b, negative mode simply sets the corresponding pn-junction to reverse bias, and therefore signals 406 and 407 from normal contact 409b and open contact 408b respectively cannot be differentiated effectively.

U.S. Pat. No. 4,843,330 introduced a grid at a proximal distance above the wafer and which can be independently biased positive or negatively with respect to the wafer substrate or stage. This makes it possible to locally create an extraction or retarding field above the wafer to affect the collection of secondary electrons and the charging of wafer surface. Postek in "Critical Issues in Scanning Electron Microscope Metrology", J. Res. Natl. Inst. Stand. Technol. 99, 641 (1994), pp. 662, reported a similar approach by Hitachi using an electrode to control the local field, enhancing the collection of SE. Paul (U.S. Pat. No. 6,720,779) claimed a method which utilizes a much higher extraction field to trigger the reverse biased pn-junction to junction breakdown.

Figure 5:
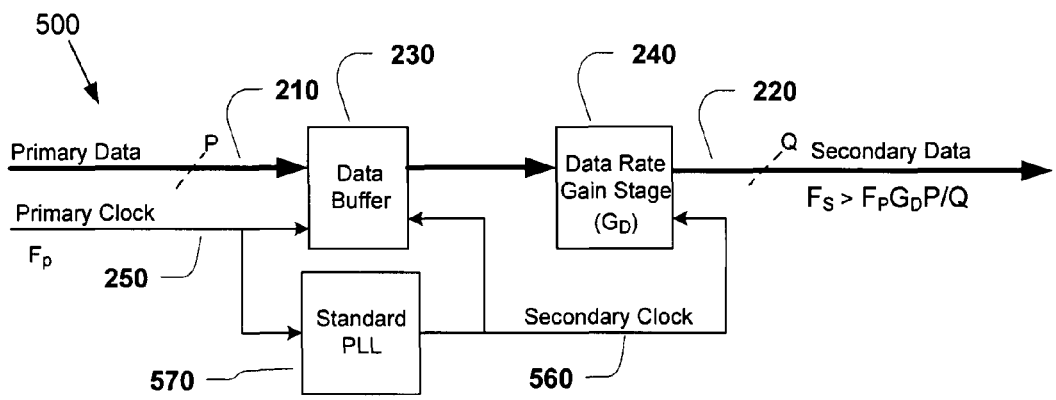
FIG. 5 illustrates the extraction field mode for identifying open contact to both N+ on PMOS and P+ on NMOS.

FIG. 5 shows a third conventional embodiment which illustrates the application of an extraction field mode to NMOS and PMOS transistors 502a and 502b. By increasing the positive bias voltage 510 on the grid 512 located between the objective lens 511 and the wafer 502, an extraction field is imposed on wafer surface. As it increases, the pn-junction of NMOS transistor 502a is set in close proximity to reverse breakdown. Excessive positive charges on the normal contact 508a will trigger the junction leak, thus the contact no longer accumulates charge. This lack of accumulation differentiates the signals 505 of an open contact 509a from signals 504 of a normal contact 508a for NMOS. With this embodiment, the open contacts 509a and 509b of both NMOS transistor 502a and PMOS transistor 502b can be identified as dark voltage contrast images due to their relatively weak SE signals 505 and 507 compared to normal signals 504 and 506.

The third conventional embodiment overcomes the difficulty of the second conventional embodiment. However, there is a high risk of electrical arcing over the rough surface due to the strong extraction field, which can reach voltages up to and beyond 1000V/mm. Also, the pn-junction sometimes may be over stressed causing permanent damage.

Figure 6:
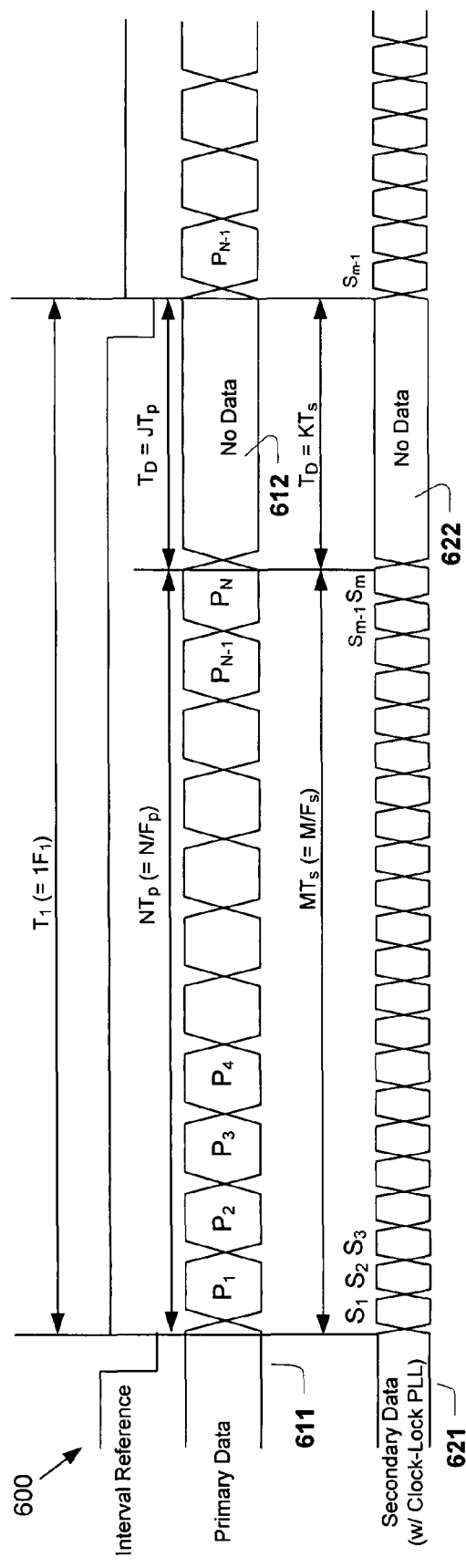
FIG. 6 illustrates the retarding field mode for identifying open contact P+ on NMOS.

A fourth conventional embodiment as shown in FIG. 6 biases the grid 612 at a negative voltage 610 with respect to the wafer 602. Retarding field helps provide a negative charge to the wafer surface and contacts, resulting in a forward bias voltage on the pn-junctions of NMOS 602a. The pn-junction is turned on and drains away excessive charges, resulting less SE signals 604 from a normal contact 608a. For an open contact 609a, charges accumulate continuously to reduce the retarding field, and as a result more SE 605 can escape from the surface and show as bright VC. This embodiment is not sensitive enough for the detecting or reviewing of open contacts to PMOS devices.

The negative mode in the second conventional embodiment of FIG. 4 and the retarding field mode in the fourth conventional embodiment of FIG. 6 both rely on the primary electron beam as the source for surface negative charging.

Simultaneously the difference of surface charging is also sensed by the same primary electron beam. The multiple tasks imposed on the primary beam sometimes cannot be fully accomplished at a given sampling time, and therefore multiple scans must be utilized resulting in a trade off in throughput.

Figure 7:
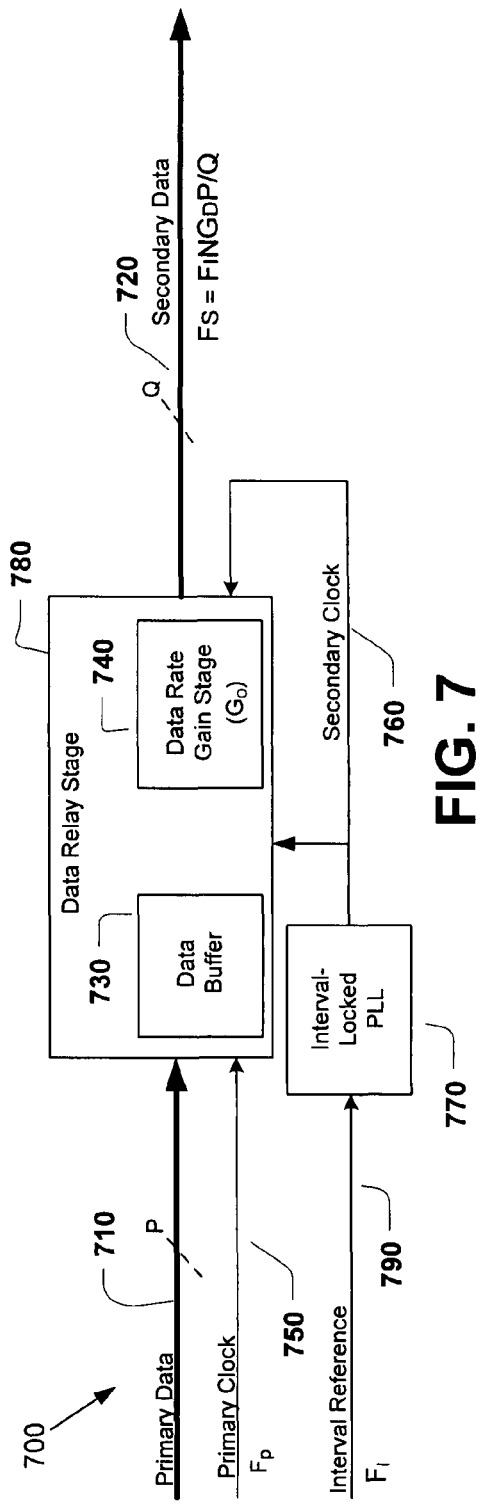
FIG. 7 illustrate the retarding field mode for identifying open contact P+ on NMOS with pre-set negative surface charging produce by electron flooding gun.

U.S. Pat. No. 4,417,203 describes a second source of electron beam, called a flood gun, to create a negative charging on the wafer surface in advance prior to imaging, as indicated by 713 in FIG. 7. This patent is consistent with the second conventional embodiment of FIG. 4 and the fourth conventional embodiment of FIG. 6 in realizing a negative charged surface. If combined together with properly optimized conditions, the detecting or reviewing of the open contact to the NMOS transistor will be more effective and sensitive. FIG. 7 shows the combination as a fifth conventional embodiment.

Similar to the second conventional embodiment of FIG. 4, the fourth and fifth conventional embodiments of FIGS. 6 and 7 provide a better indication of an open contact to an NMOS device. But there are other issues which arise from utilizing a strong retarding field: SE signals are significantly suppressed and signal to noise ratio is relative low. Furthermore, the developing of negative surface charging is difficult to control and maintain in a uniform and stable state.

Figure 8:
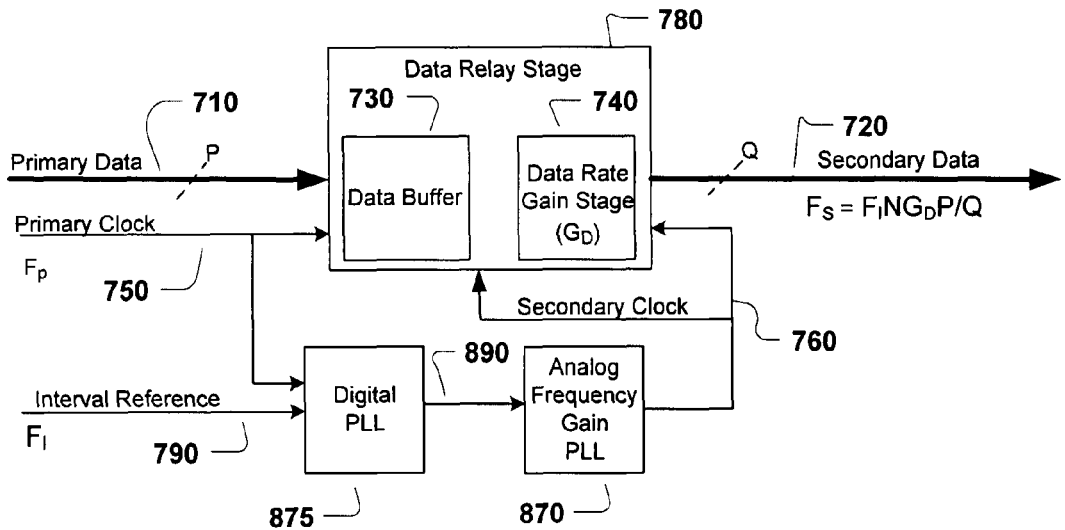
FIG. 8 is a typical DRAM cell circuit using one NMOS transistor and one capacitor.
Figure 9:
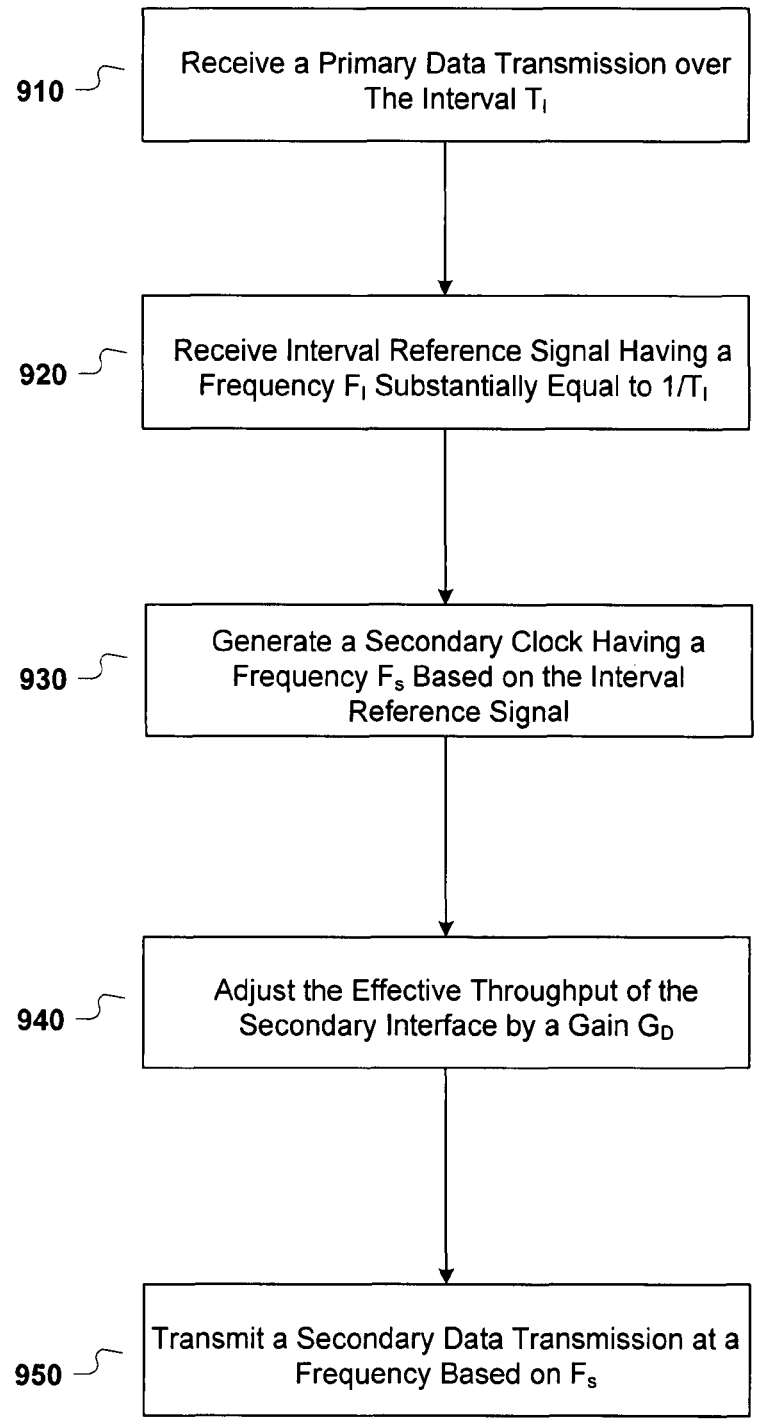
FIG. 9 is the cross-section of a DRAM cell with a deep trench capacitor which also illustrates the difficulties in producing difference signals between a normal and an open bit contact.

FIG. 8 illustrates a memory cell utilized in a DRAM. A memory cell comprises a NMOS transistor 802 and a capacitor 804. For a deep trench DRAM, the capacitor and gate are formed at the early process steps, thus they are buried in a dielectric layer. If the relevant pn-junction leak current 914 is minimal, FIG. 9 illustrates the difficulties in producing difference between signal 903 from a normal bit contact 909 and 905 from an open bit contact 908.

A method and system in accordance with the present invention overcoming the above-described problems and provides a method and system for detecting or reviewing open contacts on a semiconductor device such as a DRAM.

In general for the method and system, two steps of scanning are involved with either one or two sources of beams: the first source is of primary electron beam for imaging; the second source is an accessory beam can be either an electron beam, ion beam, or laser beam for pre-charging the device into expected status.

In one embodiment, a method is disclosed which comprises scanning a specific area of common gate contacts of MOS devices with second source of beam a plurality of times, until the gate is positively charged enough over a threshold voltage. Then scanning the associated source and/or drain contacts with first beam source in order to excite SE signals and form a voltage contrast image. The image is then analyzed to observe the grey level of the contact to reveal the difference in electrical properties, or the scanned image is compared with a reference image to detect contacts with an abnormal grey level as defective contacts.

In another embodiment, a method is disclosed which comprises scanning the gate contact area and source and/or drain contact area simultaneously with an accessory beam a plurality of times. Then scanning the source and/or drain contacts with the first beam source in order to excite SE signals and form a voltage contrast image. The image is then analyzed to observe the grey level of the contact to reveal the electrical properties difference quantitatively, or the scanned image is compared with a reference image to detect contacts which display an abnormal grey level as defective cells.

To describe the features of the present invention in more detail, refer now to the following discussion in conjunction with the accompanying figures.

Figure 10:
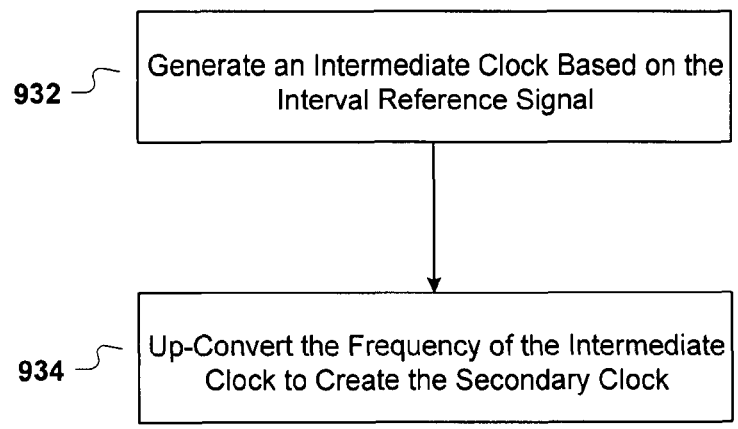
FIG. 10 is the sub-array architecture of a DRAM.
Figure 11:
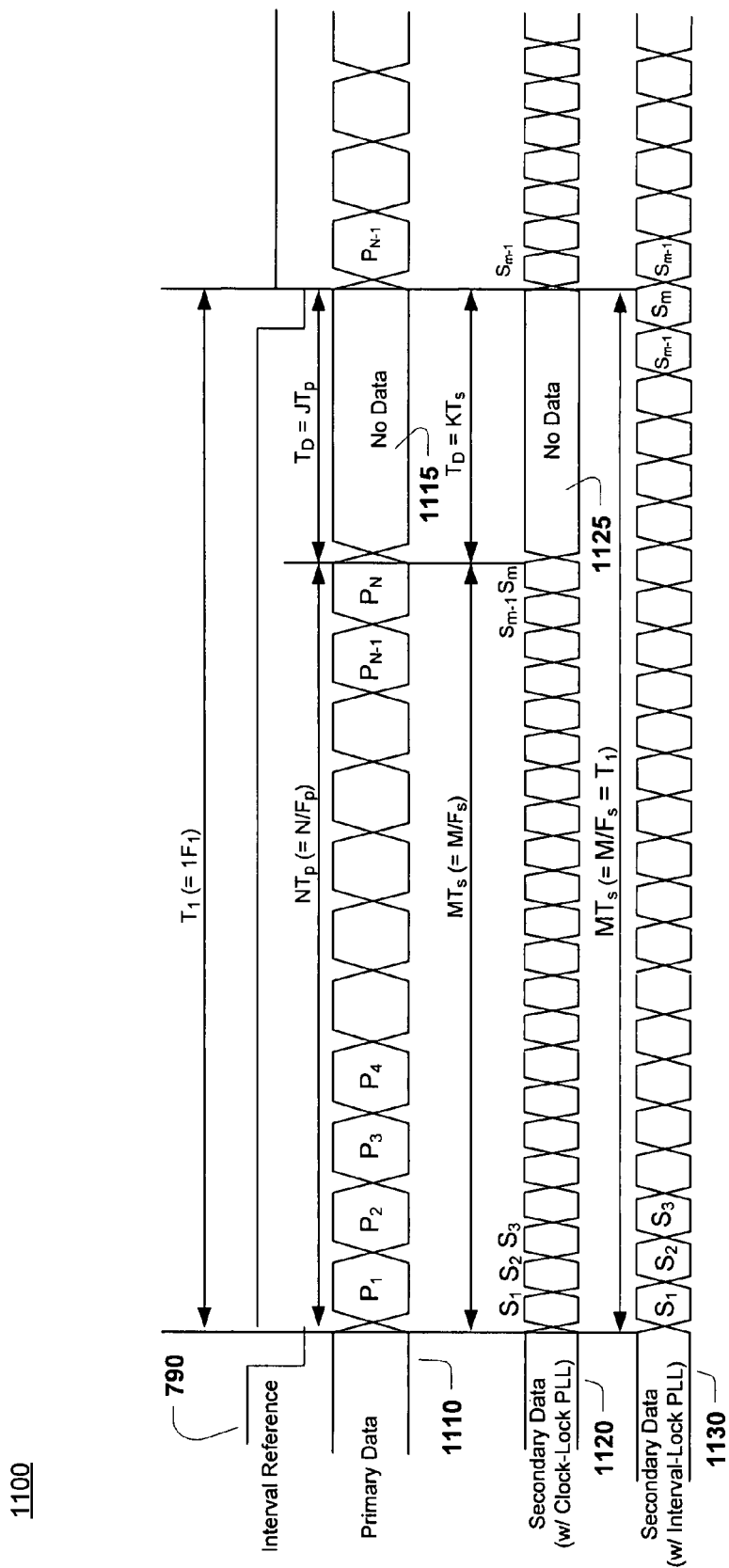
FIG. 11 is the folded architecture layout of a sub array.

Memory cells are arranged into rows and columns to form a memory array. FIG. 10 shows the layout 1000 of a cell array in folded architecture, as well as an example of cross-sections 1002 at the manufacturing step of the bit contact layer. Word lines 1003 connect the columns of the memory array, and bit lines 1004 connect the rows of bit contact of the memory array. A word line decoder (not shown) is connected to the word lines for selecting one of the word lines. A sense amplifier (not shown) is connected to the bit lines to sense a voltage change on the bit line in an array. FIG. 11 illustrates complete sub-array circuitry architecture 1100.

A DRAM operates by sending a charge through the appropriate contacts to the world line to activate the transistor at each bit. When writing, the bit lines contain the state that the capacitor should hold. When reading, the sense-amplifier determines the level of charge in the capacitor.

Figure 12:
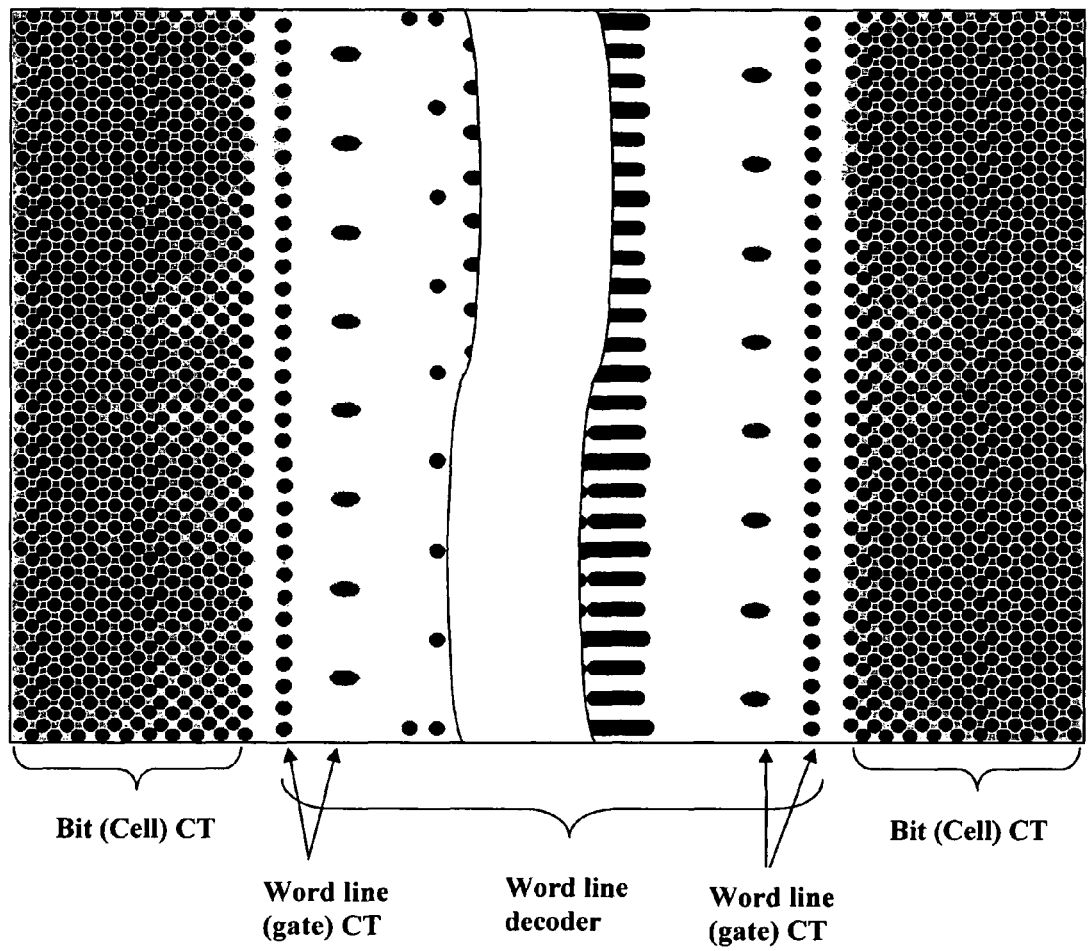
FIG. 12 shows the cross section a pair of cells at the step after bit contact is formed.

During deep trench DRAM manufacturing, when the manufacturing process reaches the bit contact layer step, both the world line and the cell capacitor have been already fabricated and buried in the dielectric. From the top layer, an SEM image can only resolve the bit contacts and other contacts of control circuitry. FIG. 12 shows the top view of cell arrays and word line decoder circuitry. The gate of cells along a word line can only be accessed via word line contacts.

As defined hereinbefore, conventional approaches focus on ways to manipulate the associated pn-junctions into different kinds of mode or status. They all exhibit ineffectiveness in identifying open bit contacts at the bit contact layer. For a deep trench DRAM, the buried capacitor causes the source and/or drain of the NMOS cell to have an unbalanced connection. When a scanning process is carried out utilizing an electron beam, charging over the source and/or drain will result in a potential drop between them. If the there is way to turn the NMOS cell into expected status, it will create an opportunity for detecting or reviewing the open bit contacts.

If the cell gates are turned off, each bit contact is isolated from its cell capacitor. When scanning the cell array solely by primary electron beam, the charges induced on the cells, with reference to FIG. 9, cannot drain to the cell capacitors even if the contact is normal. This makes an open bit contact 909 indistinguishable from a normal bit contact 908.

Figure 13:
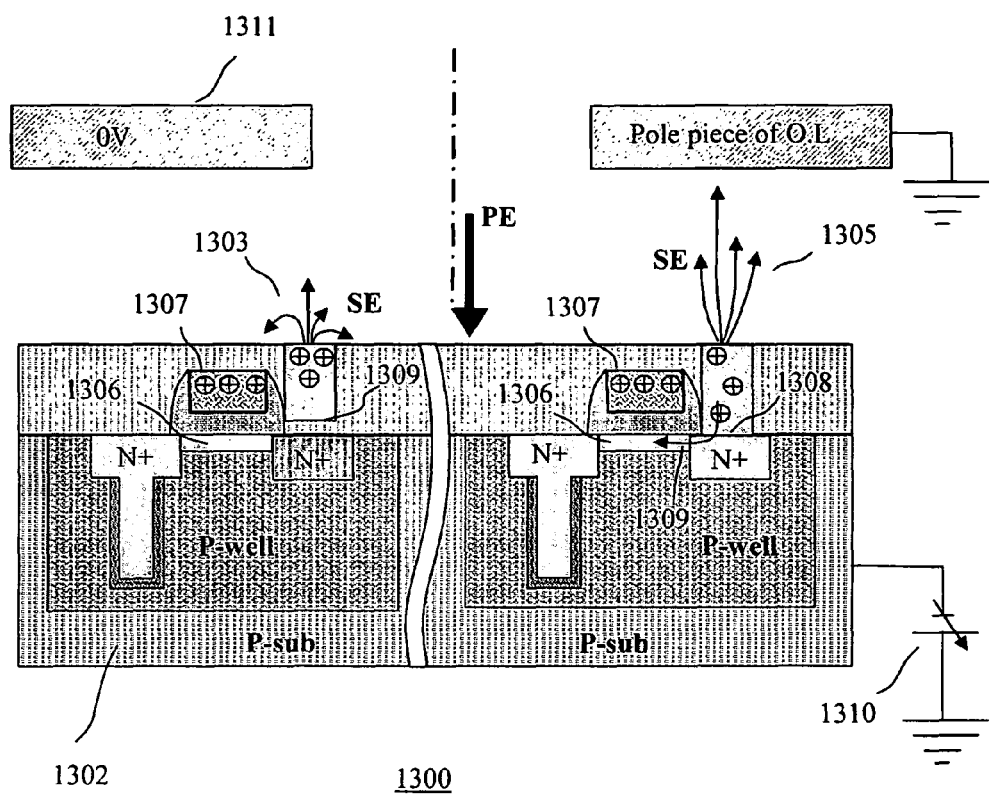
FIG. 13 illustrates how an open bit contact of DRAM is detected or reviewed after pre-charging the gate positively in accordance with the present invention.
Figure 14:
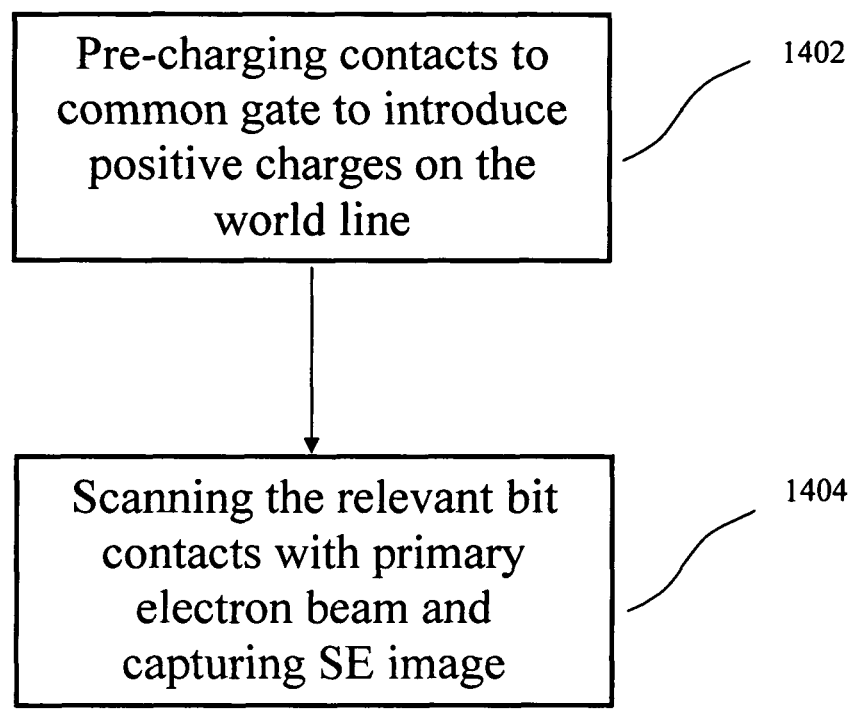
FIG. 14 is a flow chart of a process for detecting or reviewing an open contact in a DRAM in accordance with the present invention.

If a cell gate is turned on, i.e., the word line 1307, as shown in FIG. 13, is positively charged over Vdd, an inversion layer 1306 is created below the gate, wherein electrons are the dominant carrier in the narrow band. By scanning the cell array with a primary beam of proper landing energy, positive charging can be generated on the bit contacts. For a normal contact 1308, positive charges drain to their capacitors via the inversion layer 1306, while for open contact 1309, charges accumulate. Positive charging results in a relatively weak SE signal 1303 compared to 1305, thus the open contact 1309 should appear dark from a voltage contrast image. Accordingly, it is desirable to image bit contacts with gate turned on. Detecting or reviewing open bit contacts at bit contact layer generally involves two separate steps for a complete sequence as shown in FIG. 14.

In a first step 1402, the gate contacts are precharged to introduce a positive charge on the word lines which are high enough to turn on the transistor. Unlike the cell capacitors which leak the charging in Pico-seconds, the resulting positive charging on word lines can be held for a significant period of time, for instance tens of minutes or hours at vacuum.

The second step 1404 is to scan the relevant bit contacts over the cell array with a primary electron beam to simulate the process of writing and capture an SE image simultaneously. It is necessary to use a proper landing energy between $E_1$ and $E_2$ for the bit contact material used, so that positive charges can be induced. This is equivalent to charging up the cell for writing. If a bit contact is normal, the charging will be written to its corresponding cell capacitor. Since the bit contact capacitor is so large with respect to the charging current, or the leakage is so significant that capacitor cannot be charged to full capacity within given scan rate or pixel dwelling time, the contact will remain at low voltage. If there is an open contact, the charge on the contact cannot release to the cell capacitor, thus makes the open contact appears relatively darker than normal.

Figure 15A:
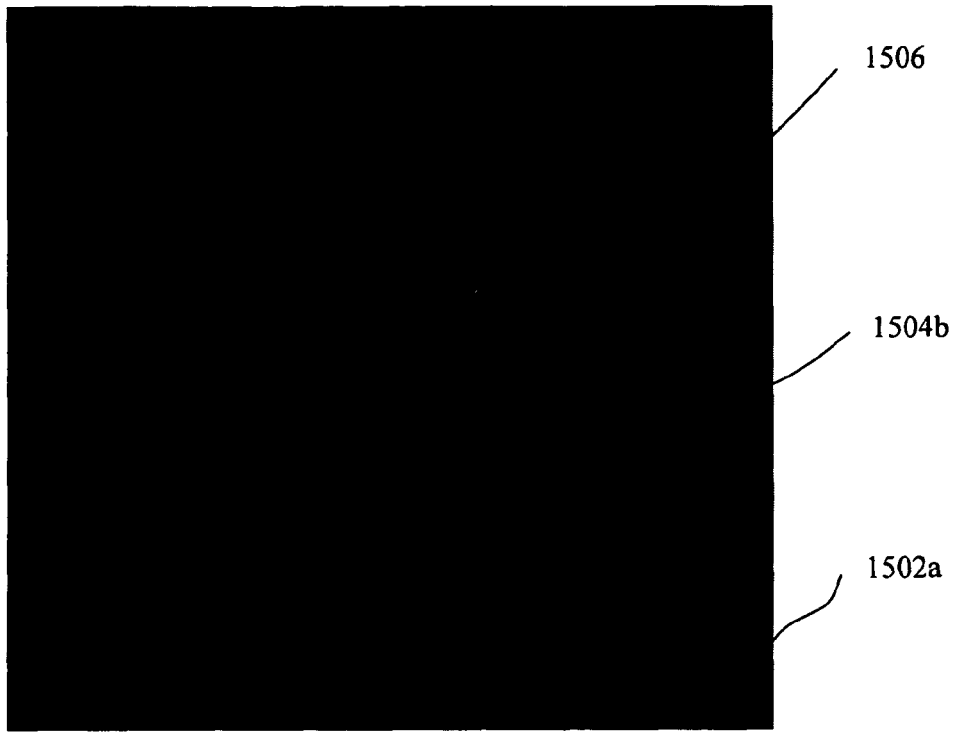
FIGS. 15a and 15b show two images of an open bit contact before and after world lines are activated.
Figure 15B:
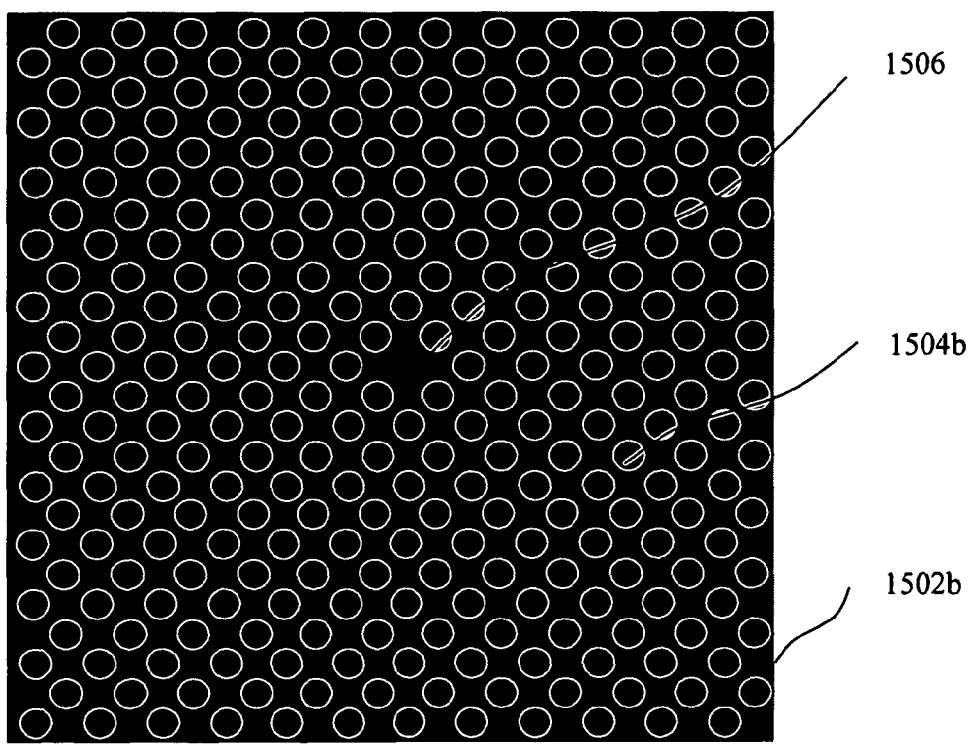

FIGS. 15a and 15b show the images of the cell array an open bit contact before (1502a) and after (1502b) word lines are activated. As is seen, the normal contacts 1504 are turned from dark 1504b to bright 1504a after activating gate, making the open contact 1506 stand out apparently as a dark VC.

In one embodiment the DRAM or the like structure can be part of a test structure in which the source and/or drain contacts constitute an array and share one or multiple common gates. Utilizing a system and method in accordance with the present invention allows for a more efficient detecting or reviewing of the electrical defects occurring in the relevant process.

There are multiple embodiments which may be utilized to achieve the pre-charge of the word line over the word line decoder circuitry.

According to one embodiment, a simple way is to use the same primary electron beam as is utilized in the SEM for imaging, with the same beam condition or not, to pre-scan the gate contacts at either the level of decoder circuitry or the entire wafer. The goal is to accumulate enough positive charge voltage on the word line to turn on the gate of each cell. Due to the limited primary beam current, the pre-scan may be carried out one or a plurality of times to establish the designated charging voltage.

According to a second embodiment, an electron beam originated from a second electron source is used to induce the positive charging voltage on the word line to turn on the turn on the gate of each cell. This electron beam from the secondary source can be controlled with much flexibility, so that the buried word lines can be charged to positive more effectively and efficiently. It can be controlled to scan or irradiate the word line decoder circuitry, the entire sub-array, or the entire wafer, multiple times or a single time. This turns on the gate of each cell and sets up the device condition for the next step of voltage contrast imaging with the primary electron beam.

According to a third embodiment, a positive ion beam is used to achieve a positive charge on the buried word lines either by scanning or irradiating gate contacts over word line decoder circuitry, or simply over the entire wafer. This also turns on the gate of each cell and sets up the device condition for the next step of voltage contrast imaging with the primary electron beam.

According to a fourth embodiment, an UV light, instead of charged particles, is used to induce a positive charge on the buried word lines. Irradiating the gate contacts of decoder or the entire wafer with light rays of wave lengths ranging from 300 nm to 1200 nm, also excites the SE, and leaves positive charges behind. The level of positive charging can be controlled by the duration or power of the light. This also turns on the gate of each cell and sets up the device condition for a next step of voltage contrast imaging with the primary electron beam.

The electron beam of the secondary source, the ion beam, and the UV light are generally referred as accessory beams hereafter.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for inspecting electrical defects on a semiconductor wafer with a scanning electron microscope (SEM), the semiconductor wafer including a plurality of contacts to MOS devices, the method comprising:
providing positive charging over at least an area of gate contacts sufficient enough to turn on the associated MOS devices on the wafer;
scanning at least an area of source or drain contacts of the MOS devices with a primary electron beam of proper landing energy to charge the source or drain contacts and generate a single images, wherein one source and drain of the MOS devices are conducted to the source or drain contacts accessible from the surface of a dielectric layer covering the MOS devices, and another one of the source and drain of the MOS devices are buried below the dielectric layer and electrically coupled with a substrate; and
analyzing the single image of contacts and identifying the open source or drain contacts.

2. The method of claim 1 wherein providing the positive charge comprises pre-scanning at least an area of gate contacts on the wafer by the primary electron beam one or more times at a proper landing energy to provide a positive charge sufficient to turn on a gate of the associated MOS device.

3. The method of claim 1 wherein providing the positive charge comprises irradiating at least an area of gate contacts on the wafer by a primary electron beam one or more times at a proper landing energy to provide a positive charge sufficient to turn on the gate of the associated MOS device.

4. The method of claim 2 wherein the landing energy lies in the range between the first and second crossover points ($E_1$ and $E_2$) for the contact materials used.

5. The method of claim 2 wherein the primary beam used for pre-scanning of the area(s) of gate contacts and for imaging scanning of the area(s) of source and/or drain contacts can be of different conditions in landing energy, beam current, spot size, and retarding/extraction field strength.

6. The method of claim 3 wherein the landing energy lies in the range between the first and second crossover points ($E_1$ and $E_2$) for the contact materials used.

7. The method of claim 3 wherein primary beam used for irradiating of the area(s) of gate contacts and for imaging scanning of the area(s) of source and/or drain contacts can be of different conditions in landing energy, beam current, spot size, and retarding/extraction field strength.

8. The method of claim 2 wherein the area of source and/or drain contacts for imaging and the area(s) of gate contacts for pre-charging is separated from each other, or overlapped.

9. The method of claim 3 wherein the area of source and/or drain contacts for imaging and the area(s) of gate contacts for pre-charging is separated from each other, or overlapped.

10. A method for inspecting electrical defects a semiconductor wafer with a scanning electron microscope (SEM), the semiconductor wafer including a plurality of contacts to semiconductor devices, the method comprising:
pre-scanning the at least a portion of semiconductor wafer with at least an accessory beam, one or more times, to achieve positive charge that is sufficient to turn on the gate of the associated semiconductor devices on the wafer;

scanning at least an area of interest on the semiconductor wafer with a primary electron beam of proper landing energy to charge the contacts and generate a single image of an area of interest, wherein one of source and drain of the semiconductor devices are connected to contacts accessible from a surface of a dielectric layer covers the semiconductor devices, and another one of source and drain of the semiconductor devices are buried below the dielectric layer and electrically coupled with a substrate; and analyzing the single image to identify the open contacts.

11. The method of claim 10 wherein the portion for pre-scanning by accessory beam contains the area of interest for primary beam imaging scanning.

12. The method of claim 10 wherein the accessory beam can be any of or any combination of:

an electron beam originated from the same source as primary electron beam as used in the SEM; an electron beam generated from a different electron source; an ion beam; and an ultraviolet (UV) light within a predetermined wave length range.

13. The method of claim 12 wherein the predetermined wavelength range comprises 300 nm to 1200 nm.

14. A method for inspecting open contacts on a dynamic random access memory (DRAM) comprising:

providing a positive charge on a plurality of word line contacts that is high enough to turn on the NMOS of cell array within the DRAM wherein the DRAM further comprises a trench DRAM;

scanning relevant bit contacts within the cell array to charge the storage components by a primary electron beam of proper landing energy and capture a secondary electron (SE) to form an image, wherein the bit contacts, accessible by primary electron beam from the surface of a dielectric layer covering the NMOS devices, land on one of source and drain of the NMOS devices in the cell array, and storage components, buried below the dielectric layer covering the NMOS devices, connect to another one of the source and drain of each NMOS device in the cell array; and analyzing the SE image to determine if any of the relevant bit contacts is open.

15. The method of claim 14 wherein the positive charge providing step is provided by utilizing the primary electron beam to pre-scan the word line contacts of DRAM.

16. The method of claim 14 wherein the positive charge providing step is provided by utilizing at least an accessory beam to pre-scan and/or irritate the word line contacts DRAM.

17. The method of claim 16 wherein the accessory beams are provided by any or any combination of an electron beam originated from the same source as primary electron beam as used in the SEM; an electron beam generated from a different electron source; positive ion beams; and an ultraviolet (UV) light within a predetermined wave length range.

18. The method of claim 14 wherein the positive charge providing steps comprises pre-scanning the semiconductor device one or more times by the primary electron beam.

19. The method of claim 14 wherein the positive charge providing steps comprises pre-scanning and/or irradiating semiconductor device one or more times with at least an accessory beam.

20. The method of claim 14 wherein the landing energy lies in the range between the first and second crossover points ($E_1$ and $E_2$) for the contact materials used.

21. A system for inspecting electrical defects on a semiconductor wafer with a scanning electron microscope (SEM), the semiconductor wafer including a plurality of contacts to MOS devices, the system comprising:

means for providing a positive charge over at least a portion of wafer containing gate contacts to turn on the associated MOS devices by using a primary electron beam;

means for scanning at least an area of interest containing source or drain contacts within the MOS devices with the primary electron beam of proper landing energy to charge the area of interest and generate images, wherein one of source and drain of the MOS devices have the contacts accessible from a surface of a dielectric layer covers the MOS devices, and another one of source and drain of the MOS devices connect to an electrical devices buried below the dielectric layer and electrically coupled with a substrate; and means for analyzing the image of contacts to identify the open contacts.

22. The system of claim 21 wherein providing the positive charge means comprises means for pre-scanning at least a portion of the wafer containing gate contacts by the primary electron beam one or more times at a proper landing energy to provide a positive charge sufficient to turn on a gate of the associated MOS device.

23. The system of claim 21 wherein providing the positive charge means comprises means for irradiating at least a portion of the wafer containing gate contacts by a primary electron beam one or more times at a proper landing energy to provide a positive charge sufficient to turn on the gate of the associated MOS device.

24. The system of claim 22 wherein the landing energy lies in the range between the first and second crossover points ($E_1$ and $E_2$) for the contact materials used.

25. The system of claim 22 wherein primary beam used for pre-scanning of a portion of wafer and for imaging scanning of an area of interest can be of different conditions in landing energy, beam current, spot size, and retarding/extraction field strength.

26. The system of claim 23 wherein the landing energy lies in the range between the first and second crossover points ($E_1$ and $E_2$) for the contact materials used.

27. The system of claim 23 wherein primary beam used for pre-scanning of a portion of wafer and for imaging scanning of an area of interest can be of different conditions in landing energy, beam current, spot size, and retarding/extraction field strength.

28. The system of claim 22 wherein the area of interest containing source and/or drain contacts and the portion of wafer containing gate contacts are separated from each other, or overlapped.

29. The system of claim 23 wherein the area of interest containing source and/or drain contacts and the portion of wafer containing gate contacts are separated from each other, or overlapped.

30. A system for inspecting a semiconductor wafer with a scanning electron microscope (SEM), the semiconductor wafer including a plurality of contacts to semiconductor devices, the system comprising:

means for pre-scanning at least a portion of semiconductor wafer with at least an accessory beam, one or more times, to achieve positive charge that is sufficient to turn on the gate on the associated semiconductor devices of the wafer;

means for scanning the at least an area of interest on the semiconductor wafer with a primary electron beam of proper landing energy to generate a single secondary electron (SE) image, wherein one of source and drain of the semiconductor devices have the contacts accessible from a surface of a dielectric layer covers the semiconductor devices, and another one of source and drain of the semiconductor devices are buried below the dielectric layer and electrically coupled with a substrate; and means for analyzing the single SE image to identify the open contacts.

31. The system of claim 30 wherein the portion of semiconductor wafer for pre-scanning or irradiating by accessory beam contains the area of interest for primary beam imaging scanning.

32. The system of claim 30 wherein the accessory beams can be any of or any combination of an electron beam originated from the same source as primary electron beam as used in the SEM; an electron beam generated from a different electron source; positive ion beams; and an ultraviolet (UV) light within a predetermined wave length range.

33. The system of claim of claim 32 wherein the predetermined wavelength range comprises 300 nm to 1200 nm.

34. A system for inspecting open contacts on a dynamic random access memory (DRAM) comprising:
means for providing a positive charge on a plurality of word line contacts that is high enough to turn on the NMOS of cell arrays within the DRAM wherein the DRAM further comprises a trench DRAM;
means for scanning relevant bit contacts within the cell array to charge the storage components by a primary electron beam of proper landing energy and capture a secondary electron (SE) to form an SE image, wherein the bit contacts, accessible by primary electron beam from the surface of a dielectric layer covering the NMOS devices, land on one of source and drain of the NMOS devices in the cell array, and storage components, buried below the dielectric layer covering the NMOS devices, connect to another one of the source and drain of each NMOS device in the cell array
means for analyzing the SE image to determine if any of the relevant bit contacts is open.

35. The system of claim 34 wherein the positive charge providing means is provided by utilizing the primary electron to pre-scan the DRAM.

36. The system of claim 34 wherein the positive charge providing means is provided by utilizing at least an accessory beam for pre-scanning or irradiating the DRAM.

37. The system of claim 36 wherein the accessory beams are provided by any or any combination of an electron beam originated from the same source as primary electron beam as used in the SEM; an electron beam generated from a different electron source; positive ion beams; and an ultraviolet (UV) light within a predetermined wave length range.

38. The system of claim 34 wherein the positive charge providing means comprises pre-scanning the DRAM devices one or more times by the primary electron beam.

39. The system of claim 34 wherein the positive charge providing means comprises pre-scanning the DRAM devices one or more times with at least an accessory beam.

40. The system of claim 34 wherein the landing energy lies in the range between the first and second crossover points ($E_1$ and $E_2$) for the contact materials used.

41. A method for inspecting open contacts on a test structure on wafer comprising:
providing a positive charge at least on a portion of a test structure that is high enough to turn on relevant devices by using a primary electron beam;
scanning relevant contacts contacted to at least a portion of test structure by the primary electron beam of proper landing energy to capture secondary electron (SE) images, wherein one of source and drain of the test structure has the relevant contact accessible from a surface of a dielectric layer covers the test structure, and another one of source and drain of the test structure is buried below the dielectric layer and electrically coupled with a substrate; and
analyzing the SE images to determine if any of the relevant contacts is open.

42. The method of claim 41 wherein the test structure comprises at least one or more NMOS devices with independent or common gates, and with virtually grounded sources and/or drains in connection to large capacitors or substrate.

43. The method of claim 41 wherein the test structure comprises source and/or drain contact(s) and gate contact(s) which are separated into different areas, or interlaced one with another.

44. The method of claim 41 wherein the positive charge providing step is provided by utilizing the primary electron to pre-scan the gate contacts of test structure or the entire test structure.

45. The method of claim 41 wherein the positive charge providing step is provided by utilizing at least an accessory beam to pre-scan or irradiate the gate contacts of test structure or the entire test structure, or the entire wafer.

46. The method of claim 45 wherein the accessory beams are provided by any or any combination of an electron beam from the same source, an electron beam from another source, a positive ion beam, or ultraviolet light at predetermined range of wavelengths.

47. The method of claim 41 wherein the positive charge providing steps comprises pre-scanning the gate contact(s) of the test structure or entire test structure one or more times by the primary electron beam.

48. The method of claim 41 wherein the positive charge providing step comprises pre-scanning the gate contacts of test structure, or the entire test structure, or the entire wafer with at least an accessory beam.

49. The method of claim 41 wherein the landing energy lies in the range the first and second crossover points ($E_1$ and $E_2$) for the contact materials used.

50. A system for inspecting open contacts to a test structure comprising:
means for providing a positive charge at least on a portion of a test structure that is high enough to turn on relevant devices by using a primary electron beam;
means for scanning relevant contacts connected to at least a portion of test structure by the primary electron beam of proper landing energy to capture secondary electron (SE) images, wherein one of source and drain of the test structure has the relevant contact accessible from a surface of a dielectric layer covers the test structure, and another one of source and drain of the test structure is buried below the dielectric layer and electrically coupled with a substrate; and
means for analyzing the SE image to determine if any of the relevant contacts is open.

51. The system of claim 50 wherein the positive charge providing means is provided by utilizing the primary electron to pre-scan a portion of or entire test structure.

52. The system of claim 50 wherein the positive charge providing means is provided by utilizing an accessory beam to pre-scan a portion of the test structure, or the entire test structure, or the entire wafer.

53. The system of claim 52 wherein the accessory beams are provided by any or any combination of an electron beam from the same source, an electron beam from another source, a positive ion beam, or ultraviolet light at predetermined range of wavelengths.

54. The system of claim 50 wherein the positive charge providing means comprises pre-scanning the test structure one or more times by the primary electron beam.

55. The system of claim 50 wherein the positive charge providing means comprises pre-scanning the test structure one or more times with an accessory beam.

56. A method for inspecting an electrical defect on a contact to a source/drain of a MOS device on a semiconductor wafer, said method comprising:
   positively charging a gate contact of said MOS device to turn on said MOS device by using a primary electron beam;
   scanning said contact of said source/drain with said primary electron beam of proper landing energy to generate an image; and
   analyzing said single image to identify whether said contact is open.

57. A method for inspecting an electrical defect on a trench DRAM, said method comprising:
   positively charging a gate contact of said trench DRAM to turn on a MOS device of said trench DRAM;
   scanning a bit line contact of said MOS device with a primary electron beam of proper landing energy to generate an image; and
   analyzing said image to identify whether said bit line contact is open.

58. A system for inspecting an electrical defect on a trench DRAM, said system comprising:
   means for positively charging a gate contact of said trench DRAM to turn on a MOS device of said trench DRAM;
   means for scanning a bit line contact of said MOS device with a primary electron beam of proper landing energy to generate an image; and
   means for analyzing said image to identify whether said bit line contact is open.

* * * * *